US011851515B2

(12) United States Patent
Jang et al.

(10) Patent No.: US 11,851,515 B2
(45) Date of Patent: Dec. 26, 2023

(54) PHOTOPOLYMER COMPOSITION

(71) Applicant: LG CHEM, LTD., Seoul (KR)

(72) Inventors: Seokhoon Jang, Daejeon (KR); Heon Kim, Daejeon (KR); Se Hyun Kwon, Daejeon (KR); Yeongrae Chang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 338 days.

(21) Appl. No.: 17/280,077

(22) PCT Filed: Jun. 29, 2020

(86) PCT No.: PCT/KR2020/008465
§ 371 (c)(1),
(2) Date: Mar. 25, 2021

(87) PCT Pub. No.: WO2021/002648
PCT Pub. Date: Jan. 7, 2021

(65) Prior Publication Data
US 2021/0340302 A1    Nov. 4, 2021

(30) Foreign Application Priority Data
Jul. 2, 2019   (KR) .................. 10-2019-0079367

(51) Int. Cl.
| | | |
|---|---|---|
| *G03H 1/02* | (2006.01) | |
| *C08F 2/50* | (2006.01) | |
| *C08F 220/20* | (2006.01) | |
| *C08F 283/12* | (2006.01) | |
| *G03F 7/032* | (2006.01) | |

(52) U.S. Cl.
CPC ............ *C08F 283/128* (2013.01); *C08F 2/50* (2013.01); *G03H 1/02* (2013.01); *C08F 220/20* (2013.01); *G03H 2001/0216* (2013.01); *G03H 2001/0264* (2013.01); *G03H 2210/10* (2013.01); *G03H 2260/12* (2013.01)

(58) Field of Classification Search
None
See application file for complete search history.

(56) References Cited

U.S. PATENT DOCUMENTS

| 8,722,755 B2 | 5/2014 | Tsai et al. |
|---|---|---|
| 2005/0214650 A1 | 9/2005 | Takizawa et al. |
| 2005/0277747 A1* | 12/2005 | McLaughlin .......... G11B 7/245 |
| 2010/0280148 A1 | 11/2010 | Webster et al. |
| 2013/0041099 A1 | 2/2013 | Webster et al. |
| 2013/0245150 A1 | 9/2013 | Tsai et al. |
| 2017/0121469 A1 | 5/2017 | Kobilka et al. |
| 2019/0185592 A1 | 6/2019 | Kim et al. |
| 2020/0150528 A1 | 5/2020 | Jang et al. |
| 2020/0192218 A1 | 6/2020 | Jang et al. |
| 2023/0142827 A1* | 5/2023 | Lee ...................... G03F 7/033 430/1 |

FOREIGN PATENT DOCUMENTS

| JP | 60196346 A | * 10/1985 | ............... B41C 1/10 |
|---|---|---|---|
| JP | 2005055472 A | 3/2005 | |
| JP | 2005309359 A | 11/2005 | |
| JP | 2008502940 A | 1/2008 | |
| JP | 2011-221192 A | 11/2011 | |
| JP | 2014-026116 A | 2/2014 | |
| KR | 10-2005-0027566 A | 3/2005 | |
| KR | 10-2009-0000477 A | 1/2009 | |
| KR | 10-2010-0055383 A | 5/2010 | |
| KR | 10-2013-0113666 A | 10/2013 | |
| KR | 10-2019-0008767 A | 1/2019 | |
| KR | 10-2019-0069316 A | 6/2019 | |
| KR | 1020190068456 A | 6/2019 | |

OTHER PUBLICATIONS

Machine translation of JP 60-196346 (Oct. 1985).*
Sundararajan, et al. (2019) "Crosslinked Polymer Networks of Poly(ethylene glycol) (PEG) and Hydroxyl Terminated Poly(dimethyl siloxane) (HTPDMS) as Polymeric Phase Change Material for Thermal Energy Storage." Solar Energy, vol. 181.pp 187-194.
Shishido, et al. (2012). "Liquid-Crystalline Polymer Holograms for High-Density Optical Storage and Photomechanical Analysis." Chemical Resources Laboratory, Tokyo Institute of Technology, Liquid Crystals XVI, Proc. of SPIE vol. OP211, pp. 84750F-1 to 84750F-7.

* cited by examiner

*Primary Examiner* — Martin J Angebranndt
(74) *Attorney, Agent, or Firm* — Bryan Cave Leighton Paisner LLP

(57) ABSTRACT

The present disclosure relates to a photopolymer composition including a polymer matrix or a precursor thereof having a predetermined chemical structure; a photoreactive monomer; and a photoinitiator, a hologram recording medium, an optical element and a holographic recording method using the same.

16 Claims, No Drawings

PHOTOPOLYMER COMPOSITION

CROSS-REFERENCE TO RELATED APPLICATION(S)

This application is a National Phase entry pursuant to 35 U.S.C. § 371 of International Application No. PCT/KR2020/008465, filed on Jun. 29, 2020, and claims priority to and the benefit of Korean Patent Application No. 10-2019-0079367, filed on Jul. 2, 2019 with the Korean Intellectual Property Office, the disclosures of which are hereby incorporated by reference in their entirety for all purposes as if fully set forth herein.

TECHNICAL FIELD

The present disclosure relates to a photopolymer composition, a hologram recording medium, an optical element and a holographic recording method.

BACKGROUND ART

Hologram recording medium records information by changing a refractive index in the holographic recording layer in the medium through an exposure process, reads the variation of refractive index in the medium thus recorded, and reproduces the information.

When a photopolymer (photosensitive resin) is used, the light interference pattern can be easily stored as a hologram by photopolymerization of the low molecular weight monomer. Therefore, the photopolymer can be used in various fields such as optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

Typically, a photopolymer composition for hologram production comprises a polymer binder, a monomer, and a photoinitiator, and the photosensitive film produced from such a composition is irradiated with laser interference light to induce photopolymerization of local monomers.

In a portion where a relatively large number of monomers are present in such photopolymerization process, the refractive index becomes high. And in a portion where a relatively large number of polymer binders are present, the refractive index is relatively lowered and thus the refractive index modulation occurs, and a diffraction grating is generated by such refractive index modulation. The value n of refractive index modulation is influenced by the thickness and the diffraction efficiency (DE) of the photopolymer layer, and the angular selectivity increases as the thickness decreases.

Recently, development of materials capable of maintaining a stable hologram with a high diffraction efficiency has been demanded, and also various attempts have been made to manufacture a photopolymer layer having a thin thickness and a high refractive index modulation.

DETAILED DESCRIPTION OF THE INVENTION

Technical Problem

It is one object of the present disclosure to provide a photopolymer composition that can more efficiently and easily provide a photopolymer layer capable of achieving a higher refractive index modulation value even in a thin thickness range.

It is another object of the present disclosure to provide a hologram recording medium including a photopolymer layer capable of realizing a higher refractive index modulation value even in a thin thickness range.

It is still another object of the present disclosure to provide an optical element including the hologram recording medium.

It is a further object of the present disclosure to provide a holographic recording method including selectively polymerizing photoreactive monomers contained in the hologram recording medium using a coherent laser light.

Technical Solution

Provided herein is a photopolymer composition for forming a hologram recording medium comprising: a polymer matrix or a precursor thereof formed by crosslinking a siloxane-based polymer containing at least one silane functional group (Si—H) and a (meth)acrylic polyol; a photoreactive monomer; and a photoinitiator.

Also provided herein is a hologram recording medium produced from the photopolymer composition.

Further provided herein is an optical element including the hologram recording medium.

Further provided herein is a holographic recording method comprising selectively polymerizing photoreactive monomers contained in the hologram recording medium using a coherent light source.

Hereinafter, the photopolymer composition, a hologram recording medium, the optical element and the holographic recording method according to a specific embodiment of the present disclosure will be described in more detail.

As used herein, the term "(meth)acrylate" refers to either methacrylate or acrylate.

As used herein, the term "(co)polymer" refers to either a homopolymer or a copolymer (including a random copolymer, a block copolymer, and a graft copolymer).

Further, the term "hologram" as used herein refers to a recording medium in which optical information is recorded in an entire visible range and a near ultraviolet range (300 to 800 nm) through an exposure process, and examples thereof include all of visual holograms such as in-line (Gabor) holograms, off-axis holograms, full-aperture transfer holograms, white light transmission holograms ("rainbow holograms"), Denisyuk holograms, off-axis reflection holograms, edge-lit holograms or holographic stereograms.

In the present disclosure, the alkyl group can be linear or branched, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present disclosure, the alkylene group is a bivalent functional group derived from alkane, and can be, for example, linear, branched or cyclic. Specific examples thereof include a methylene group, an ethylene group, a propylene group, an isobutylene group, a sec-butylene group, a tert-butylene group, a pentylene group, a hexylene group, and the like.

According to one embodiment of the present disclosure, there is provided a photopolymer composition for forming a hologram recording medium comprising: a polymer matrix or a precursor thereof formed by crosslinking a siloxane-based polymer containing at least one silane functional group (Si—H) and a (meth)acrylic polyol; a photoreactive monomer; and a photoinitiator.

The present inventors have found through experiments that the hologram produced from the photopolymer composition comprising: a polymer matrix or a precursor thereof formed by crosslinking a siloxane-based polymer containing at least one silane functional group (Si—H) and a (meth)acrylic polyol; a photoreactive monomer; and a photoinitiator can achieve a significantly improved refractive index modulation value and excellent durability against temperature and humidity compared to previously known holograms even in a thinner thickness range, thereby completing the present disclosure.

At the time of producing a coating film or a hologram from the photopolymer composition, the crosslinking density is optimized, and excellent durability against temperature and humidity compared with existing matrix can be secured. In addition, by optimizing the crosslinking density, mobility between the photoreactive monomer having a high refractive index and other components having a low refractive index can be increased, thereby maximizing the refractive index modulation and improving recording characteristics.

Further, in the present disclosure, a fluorine-based compound, a phosphate-based compound or the like can be further included as a component of the polymer matrix or the precursor thereof. The fluorine-based compound or the phosphate-based compound has a lower refractive index than the photoreactive monomer, and thus, the refractive index of the polymer matrix can be lowered and the refractive index modulation of the photopolymer composition can be maximized.

Moreover, the phosphate-based compound severs as a plasticizer to lower the glass transition temperature of the polymer matrix, thereby increasing mobility of the photoreactive monomer and low refractive components, and contributing to improving moldability of the photopolymer composition.

Meanwhile, the polymer matrix or the precursor thereof formed by crosslinking a siloxane-based polymer containing at least one silane functional group (Si—H) and a (meth) acrylic polyol can serve as a support for the photopolymer composition and a final product produced therefrom.

Further, the polymer matrix or the precursor thereof can serve to enhance the refractive index modulation of the photopolymer film due to a relatively low refractive index (e.g., n=1.40 to 1.55). Further, the polymer matrix or the precursor thereof can rapidly crosslink the matrix even at room temperature when a Pt-based catalyst is introduced.

The polymer matrix can include a hydrosilylation reactant between the siloxane-based polymer containing at least one silane functional group (Si—H) and the (meth)acrylic polyol.

Hydrosilylation between the siloxane-based polymer containing at least one silane functional group (Si—H) and the (meth)acrylic polyol can be performed in the presence of a catalyst such as Karstedt's catalyst.

The hydrosilylation reactant between the siloxane-based polymer containing at least one silane functional group (Si—H) and the (meth)acrylic polyol have properties that increase the mobility of components due to the flexible main chain of the siloxane-based polymer, and easily ensure reliability after recording through the formation of a siloxane bond having excellent heat resistance and moist heat resistance properties.

Meanwhile, the siloxane-based polymer containing at least one silane functional groups (Si—H) can include a repeating unit represented by the following Chemical Formula 1 or a repeating unit represented by the following Chemical Formula 2.

[Chemical Formula 1]

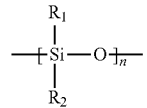

in each of the repeating units of Chemical Formula 1, $R_1$ to $R_2$ can be the same as or different from each other, and are hydrogen, halogen, or an alkyl group having 1 to 10 carbon atoms, n is the number of repetitions of the repeating unit which is 1 to 10,000, and in at least one of the repeating units, $R_1$ is an alkyl group having 1 to 10 carbon atoms and $R_2$ is hydrogen.

[Chemical Formula 2]

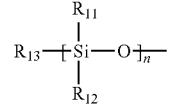

in each of the repeating units of Chemical Formula 2, $R_{11}$ to $R_{13}$ can be the same as or different from each other, and are hydrogen, halogen or an alkyl group having 1 to 10 carbon atoms, n is the number of repetitions of the repeating unit, which is 1 to 10,000, and in at least one of the repeating units, $R_{11}$ and $R_{13}$ are an alkyl group having 1 to 10 carbon atoms, $R_{12}$ is hydrogen, or $R_{11}$ and $R_{12}$ are an alkyl group having 1 to 10 carbon atoms, and $R_{13}$ is hydrogen.

The number average molecular weight (measured by GPC) of the siloxane-based polymer containing at least one silane functional group (Si—H) can be 200 to 4,000 or 350 to 2500.

The number average molecular weight means a number average molecular weight (unit: g/mol) using polystyrene calibration measured by a GPC method. In the process of determining the weight average molecular weight using polystyrene calibration measured by a GPC method, a commonly known analyzing device, a detector such as a refractive index detector, and an analytical column can be used. Commonly applied conditions for temperature, solvent, and flow rate can be used. Specific examples of the measurement conditions can include a temperature of 30° C., tetrahydrofuran solvent and a flow rate of 1 mL/min.

When the number average molecular weight of the siloxane-based polymer containing at least one silane functional group (Si—H) is too low, it is volatilized in the process of crosslinking with the polyol (40° C.), and thus, the degree of crosslinking of the matrix is lowered, which causes deterioration of recording characteristics. Further, when the weight average molecular weight of the siloxane-based polymer containing at least one silane functional group (Si—H) is too high, phase separation of the components occurs due to incompatibility with the photopolymer components, which causes deterioration of recording characteristics.

The (meth)acrylic polyol can have a structure in which two or more hydroxy groups are bonded to a main chain or side chain of the (meth)acrylate-based polymer. For example, the (meth)acrylic polyol can have a structure in which two or more carboxyl groups of the (meth)acrylate-based polymer are substituted and so the terminal has a hydroxy group.

More specifically, two or more hydroxy groups bonded to the main chain of the (meth)acrylate-based polymer can be bonded through an aliphatic divalent functional group having 1 to 30 carbon atoms, an aromatic divalent functional group having 6 to 30 carbon atoms, and the like.

Further, the (meth)acrylic polyol can have a weight average molecular weight of 200,000 to 1,000,000, preferably 400,000 to 700,000. The method of measuring the weight average molecular weight is as described above. When the weight average molecular weight of the (meth)acrylic polyol is too low, the matrix does not server as a support, and thus recording characteristics may be deteriorated with time. Further, when the weight average molecular weight of the (meth)acrylic polyol is too high, the flexibility of the matrix is reduced and the mobility of the components is reduced, which causes deterioration of the recording characteristics.

Meanwhile, the hydroxy group (—OH) equivalent of the (meth)acrylic polyol can be 500 g/equivalent to 2,500 g/equivalent, or 550 g/equivalent to 2,200 g/equivalent, or 1,000 g/equivalent to 2,000 g/equivalent.

The hydroxyl group (—OH) equivalent of the (meth)acrylic polyol is the equivalent of one hydroxy functional group (g/equivalent), and is a value obtained by dividing the weight average molecular weight of the (meth)acrylic polyol by the number of hydroxy functional groups per molecule. As the equivalent value is smaller, the density of the functional group is higher, and as the equivalent value is larger, the density of the functional group is lower.

Consequently, as the (meth)acrylic polyol has the hydroxyl group equivalent, the crosslinking density between the polymer matrix of the photopolymer composition and the (meth)acrylic polyol is optimized, and mobility between the photoreactive monomer having a high refractive index and a component having a low refractive index can be increased, thereby maximizing the refractive index modulation and improving recording properties, and further exhibiting high diffraction efficiency.

When the hydroxyl group (—OH) equivalent of the (meth)acrylic polyol is too low, the crosslinking density of the matrix is too high, which hinders the mobility of the components, and thus leads to deterioration of recording characteristics. Further, when the hydroxy group (—OH) equivalent of the (meth)acrylic polyol is too high, the crosslinking density is too low to serve as a support, the interface of the diffraction gratings generated after recording collapses, and the refractive index modulation value may decrease with the passage of time.

Meanwhile, the photoreactive monomer can include a polyfunctional (meth)acrylate monomer or a monofunctional (meth)acrylate monomer.

As described above, in a portion where the monomer is polymerized in the process of photopolymerization of the photopolymer composition and the polymer is present in relatively large amounts, the refractive index becomes high. In a portion where the polymer binder is present in relatively large amount, the refractive index becomes relatively low, the refractive index modulation occurs, and a diffraction grating is generated by such refractive index modulation.

Specifically, an example of the photoreactive monomer can include (meth)acrylate-based α,β-unsaturated carboxylic acid derivatives, for example, (meth)acrylate, (meth)acrylamide, (meth)acrylonitrile, (meth)acrylic acid or the like, or a compound containing a vinyl group or a thiol group.

An example of the photoreactive monomer can include a polyfunctional (meth)acrylate monomer having a refractive index of 1.5 or more, 1.53 or more, or 1.5 to 1.7. The polyfunctional (meth)acrylate monomer having a refractive index of 1.5 or more, or 1.53 or more, or 1.5 to 1.7 can include a halogen atom (bromine, iodine, etc.), sulfur (S), phosphorus (P), or an aromatic ring.

More specific examples of the polyfunctional (meth)acrylate monomer having a refractive index of 1.5 or more include bisphenol A modified diacrylate type, fluorene acrylate type (HR6022, etc. manufactured by Miwon Specialty Chemical Co., Ltd.), bisphenol fluorene epoxy acrylate type (HR6100, HR6060, HR6042, etc. manufactured by Miwon Specialty Chemical Co., Ltd.), halogenated epoxy acrylate series (HR1139, HR3362, etc. manufactured by Miwon Specialty Chemical Co., Ltd.).

Another example of the photoreactive monomer can include a monofunctional (meth)acrylate monomer. The monofunctional (meth)acrylate monomer can contain an ether bond and a fluorene functional group in the molecule. Specific examples of such monofunctional (meth)acrylate monomer include phenoxybenzyl (meth)acrylate, o-phenylphenol ethylene oxide (meth)acrylate, benzyl (meth)acrylate, 2-(phenylthio)ethyl (meth)acrylate, biphenylmethyl (meth)acrylate, or the like.

Meanwhile, the photoreactive monomer can have a weight average molecular weight of 50 g/mol to 1000 g/mol, or 200 g/mol to 600 g/mol. The weight average molecular weight refers to a weight average molecular weight using polystyrene calibration measured by a GPC method.

Meanwhile, the photopolymer composition of the embodiment includes a photoinitiator. The photoinitiator is a compound which is activated by light or actinic radiation and initiates polymerization of a compound containing a photoreactive functional group such as the photoreactive monomer.

As the photoinitiator, commonly known photoinitiators can be used without particular limitation, but specific examples thereof include a photoradical polymerization initiator, a photocationic polymerization initiator, or a photoanionic polymerization initiator.

Specific examples of the photoradical polymerization initiator include imidazole derivatives, bisimidazole derivatives, N-aryl glycine derivatives, organic azide compounds, titanocene, aluminate complex, organic peroxide, N-alkoxypyridinium salts, thioxanthone derivatives, amine derivatives or the like. More specifically, examples of the photoradical polymerization initiator include 1,3-di(t-butyldioxycarbonyl)benzophenone, 3,3',4,4"-tetrakis(t-butyldioxycarbonyl)benzophenone, 3-phenyl-5-isoxazolone, 2-mercapto benzimidazole, bis(2,4,5-triphenyl)imidazole, 2,2-dimethoxy-1,2-diphenylethane-1-one (product name: Irgacure 651/manufacturer: BASF), 1-hydroxy-cyclohexyl-phenyl-ketone (product name: Irgacure 184/manufacturer: BASF), 2-benzyl-2-dimethylamino-1-(4-morpholinophenyl)-butanone-1 (product name: Irgacure 369/manufacturer: BASF), and bis(η5-2,4-cyclopentadiene-1-yl)-bis(2,6-difluoro-3-(1H-pyrrole-1-yl)-phenyl)titanium (product name: Irgacure 784/manufacturer: BASF), Ebecryl P-115 (manufacturer: SK entis), and the like.

The photocationic polymerization initiator can include a diazonium salt, a sulfonium salt, or an iodonium salt, and examples thereof include sulfonic acid esters, imidosulfonates, dialkyl-4-hydroxysulfonium salts, arylsulfonic acid-p-nitrobenzyl esters, silanol-aluminum complexes, (η6-benzene) (η5-cyclopentadienyl)iron (II), or the like. In addition, benzoin tosylate, 2,5-dinitrobenzyltosylate, N-tosylphthalic acid imide, or the like can be mentioned. More specific examples of the photocationic polymerization initiator include commercially available products such as Cyracure UVI-6970, Cyracure UVI-6974 and Cyracure UVI-6990 (manufacturer: Dow Chemical Co. in USA), Irgacure 264 and Irgacure 250 (manufacturer: BASF) or CIT-1682 (manufacturer: Nippon Soda).

The photoanionic polymerization initiator can be borate salt, for example, butyryl chlorine butyl triphenyl borate, or the like. More specific examples of the photoanionic polymerization initiator include commercially available products such as Borate V (manufacturer: Spectra Group).

In addition, the photopolymer composition of the embodiment can include monomolecular (type I) initiator or bimolecular (type II) initiator. The (type I) system for free radical photopolymerization can include, for example, an aromatic ketone compounds in combination with a tertiary amine, such as benzophenone, alkylbenzophenone, 4,4'-bis(dimethylamino)benzophenone (Michler's ketone), anthrone and halogenated benzophenone or a mixture of these types. The bimolecular (type II) initiator can include benzoin and derivatives thereof, benzyl ketal, acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha-dialkoxyacetophenone, 1-[4-(phenylthio)phenyl]octane-1,2-dione 2-(O-benzoyloxime), alpha-hydroxyalkylphenone, and the like.

The photopolymer composition of the embodiment can include 1% to 80 wt. % of the polymer matrix or the precursor thereof; 1% to 80 wt. % of the photoreactive monomer; and 0.1% to 20 wt. % of the photoinitiator. When the photopolymer composition further includes an organic solvent as described hereinafter, the content of the above-mentioned components is based on the total sum of the above-mentioned components (the total sum of the components excluding the organic solvent).

The photopolymer composition can further include a fluorine-based compound. The fluorine-based compound is stable with little reactivity and has a low refractive index. Therefore, the refractive index of the polymer matrix can be lowered when the fluorine-based compound is added into the photopolymer composition, thereby maximizing the refractive index modulation with the monomer The fluorine-based compound can include at least one functional group selected from the group consisting of an ether group, an ester group and an amide group, and at least two difluoromethylene groups. More specifically, the fluorine-based compound can have a structure represented by the following Chemical Formula 4 in which a functional group including an ether group is bonded to both terminal ends of a central functional group including a direct bond between two difluoromethylene groups or an ether bond.

[Chemical Formula 4]

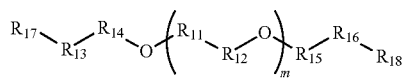

In Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, and $R_{17}$ and $R_{18}$ are each independently a polyalkylene oxide, and m is an integer of 1 or more, 1 to 10, or 1 to 3.

Preferably in Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, and $R_{17}$ and $R_{18}$ are each independently a 2-methoxyethoxymethoxy group, and m is an integer of 2.

The fluorine-based compound can have a refractive index of less than 1.45, or 1.3 or more and less than 1.45. As described above, since the photoreactive monomer has a refractive index of 1.5 or more and the fluorine-based compound has a lower refractive index than that of the photoreactive monomer, the refractive index of the polymer matrix can be further lowered, thereby maximizing the refractive index modulation with the monomer.

Specifically, the content of the fluorine-based compound can be 30 to 150 parts by weight, or 50 to 110 parts by weight based on 100 parts by weight of the photoreactive monomer, and the refractive index of the polymer matrix can be 1.46 to 1.53.

When the content of the fluorine-based compound is excessively decreased based on 100 parts by weight of the photoreactive monomer, the refractive index modulation value after recording may be lowered due to a lack of low refractive components. When the content of the fluorine-based compound is excessively increased, haze may be generated due to poor compatibility with other components or some fluorine-based compounds may be eluted to the surface of the coating layer.

The fluorine-based compound can have a weight average molecular weight (measured by GPC) of 300 or more, or 300 to 1000. A specific method of measuring the weight average molecular weight is as described above.

Meanwhile, the photopolymer composition can further include a photosensitizing dye.

The photosensitizing dye serves as a photosensitizing pigment to sensitize the photoinitiator. More specifically, the photosensitizing dye can be stimulated by the light irradiated on the photopolymer composition and can also serve as an initiator to initiate polymerization of the monomer and the cross-linking monomer. The photopolymer composition can contain 0.01 wt. % to 30 wt. %, or 0.05 wt. % to 20. wt % of the photosensitizing dye.

Examples of the photosensitizing dye are not particularly limited, and various compounds commonly known in the art can be used. Specific examples of the photosensitizing dye include sulfonium derivative of ceramidonine, new methylene blue, thioerythrosine triethylammonium, 6-acetylamino-2-methylceramidonin, eosin, erythrosine, rose bengal, thionine, basic yellow, Pinacyanol chloride, Rhodamine 6G, Gallocyanine, ethyl violet, Victoria blue R, Celestine blue, QuinaldineRed, Crystal Violet, Brilliant Green, Astrazon orange G, Darrow Red, Pyronin Y, Basic Red 29, pyrylium iodide, Safranin O, Cyanine, Methylene Blue, Azure A, or a combination of two or more thereof.

The photopolymer composition can further include an organic solvent. Non-limiting examples of the organic solvent include ketones, alcohols, acetates, ethers, and a mixture of two or more thereof.

Specific examples of the organic solvent include ketones such as methyl ethyl ketone, methyl isobutyl ketone, acetylacetone or isobutyl ketone; alcohols such as methanol, ethanol, n-propanol, i-propanol, n-butanol, i-butanol or t-butanol; acetates such as ethyl acetate, i-propyl acetate, or polyethylene glycol monomethyl ether acetate; ethers such as tetrahydrofuran or propylene glycol monomethyl ether; or a mixture of two or more thereof.

The organic solvent can be added at the time of mixing the respective components contained in the photopolymer composition, or can be contained in the photopolymer composition by adding the respective components dispersed or mixed in an organic solvent. When the content of the organic solvent in the photopolymer composition is too low, flowability of the photopolymer composition may be lowered, resulting in the occurrence of defects such as striped patterns on the finally produced film. In addition, when too much organic solvent is added, the solid content is lowered, and coating and film formation are not sufficient, so that physical properties and surface characteristics of the film may be deteriorated and defects may occur during the drying and curing process. Thus, the photopolymer composition can include an organic solvent such that the total solid content concentration of the components contained is 1 wt. % to 70 wt. %, or 2 wt. % to 50 wt. %.

The photopolymer composition can further include other additives, catalysts, and the like. For example, the photopolymer composition can include a catalyst which is commonly known for promoting polymerization of the polymer matrix or the photoreactive monomer. Examples of the catalyst include platinum-based catalysts such as Karstedt's catalyst, rhodium-based catalysts, iridium-based catalysts, rhenium-based catalysts, molybdenum-based catalysts, iron-based catalysts, nickel-based catalysts, alkali metal and alkaline earth metal catalysts. As the non-metal catalyst, a Lewis acids-based catalyst, a carbene-based catalyst, or the like can be used.

Examples of the other additives include a defoaming agent or a phosphate-based plasticizer, and the defoaming agent can be a silicone-based reactive additive, for example, Tego Rad 2500. Examples of the plasticizer include phosphate compounds such as tributyl phosphate, and the plasticizer can be added in a weight ratio of 1:5 to 5:1 together with the fluorine-based compound. The plasticizer can have a refractive index of less than 1.5 and a molecular weight of 700 or less.

The photopolymer composition can be used for hologram recording.

Meanwhile, according to another embodiment of the present disclosure, a hologram recording medium produced from the photopolymer composition can be provided.

As described above, when the photopolymer composition of one embodiment is used, it is possible to provide holograms capable of achieving a significantly improved refractive index modulation value and a high diffraction efficiency while having a thinner thickness, as compared with holograms previously known in the art.

The hologram recording medium can realize a refractive index modulation value (n) of 0.020 or more, 0.021 or more, 0.022 or more, 0.023 or more, 0.020 to 0.035, or 0.027 to 0.030 even at a thickness of 5 μm to 30 μm.

Further, the hologram recording medium can have a diffraction efficiency of 50% or more, 85% or more, or 85 to 99% at a thickness of 5 μm to 30 μm.

In the photopolymer composition of the one embodiment, the respective components contained therein are homogeneously mixed, dried and cured at a temperature of 20° C. or higher, and then predetermined exposure procedures are undertaken, thereby producing a hologram for optical application in the entire visible range and the near ultraviolet region (300 to 800 nm).

In the photopolymer composition of the one embodiment, the components for forming the polymer matrix or the precursor thereof can be first homogeneously mixed, and then the matrix is crosslinked in a liquid phase at room temperature using a Pt-based catalyst. The monomer and the initiator are added a later time to prepare the final photopolymer coating composition.

In the photopolymer composition of one embodiment, a mixing device, a stirrer, a mixer, or the like which are commonly used in the art can be used for mixing the respective components contained therein without particular limitation. The temperature in the mixing process can be 0° C. to 100° C., preferably 10° C. to 80° C., particularly preferably 20° C. to 60° C.

The drying temperature may vary depending on the composition of the photopolymer and the drying is promoted, for example, by heating at a temperature of from 30° C. to 180° C.

At the time of drying, the photopolymer can be in state of being injected into or coated onto a predetermined substrate or mold.

Meanwhile, as the method of recording a visual hologram on a hologram recording medium produced from the photopolymer composition, generally known methods can be used without particular limitation. The method described in the holographic recording method of the embodiment described hereinafter can be adopted as an example.

According to another embodiment of the present disclosure, a holographic recording method can be provided, which includes selectively polymerizing photoreactive monomers contained in the photopolymer composition using a coherent laser.

As described above, through the process of mixing and curing the photopolymer composition, it is possible to produce a medium in which no visual hologram is recorded, and a visual hologram can be recorded on the medium through a predetermined exposure process.

A visual hologram can be recorded on the media provided through the process of mixing and curing the photopolymer composition, using known devices and methods under commonly known conditions.

Meanwhile, according to another embodiment of the present disclosure, an optical element including the hologram recording medium can be provided.

Specific examples of the optical element include optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

An example of the optical element including the hologram recording medium can include a hologram display device.

The hologram display device includes a light source unit, an input unit, an optical system, and a display unit. The light source unit is a part that irradiates a laser beam used for providing, recording, and reproducing three-dimensional image information of an object in the input unit and the display unit. Further, the input unit is a part that previously inputs three-dimensional image information of an object to be recorded on the display unit, and for example, three-dimensional information of an object such as the intensity and phase of light for each space can be input into an electrically addressed liquid crystal SLM, wherein an input beam can be used. The optical system can include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

The display unit can receive three-dimensional image information of an object from an input unit, record it on a hologram plate composed of an optically addressed SLM, and reproduce the three-dimensional image of the object. Herein, the three-dimensional image information of the object can be recorded via interference of the input beam and the reference beam. The three-dimensional image information of the object recorded on the hologram plate can be reproduced into a three-dimensional image by the diffraction pattern generated by the reading beam. The erasing beam can be used to quickly remove the formed diffraction pattern. Meanwhile, the hologram plate can be moved between a position at which a three-dimensional image is input and a position at which a three-dimensional image is reproduced.

Advantageous Effects

According to the present disclosure, provided are a photopolymer composition which can more effectively and easily provide a photopolymer layer having a higher refractive index modulation value even in a thin thickness range, a hologram recording medium having a higher refractive index modulation value even in a thin thickness range, an optical element and a holographic recording method.

DETAILED DESCRIPTION OF THE EMBODIMENTS

Hereinafter, the present disclosure will be described in more detail by way of examples. However, these examples are given for illustrative purposes only and are not intended to limit the scope of the present disclosure thereto.

PREPARATION EXAMPLE

Preparation Example 1: Preparation of (Meth)Acrylic Polyol for Matrix 460 g of butyl acrylate, 276 g of methyl acrylate, and 64 g of hydroxybutyl acrylate were placed in a 2 L jacketed reactor and diluted with 1200 g of ethyl acetate. The reaction temperature was set at 60° C. to 70° C., and stirring was performed for about 30 minutes to 1 hour. 0.28 g of n-dodecyl mercaptan was further added thereto, and stirring was further performed for about 30 minutes. Thereafter, 0.32 g of AIBN as a polymerization initiator was added thereto, and polymerization was performed at the reaction temperature for 4 hours or more, and maintained until the residual acrylate content became less than 1% to obtain a (meth) acrylate-based polyol (co)polymer having a hydroxyl functional group in a branched chain (the weight average molecular weight of about 600,000, the OH equivalent of 1802 g/equivalent).

Preparation Example 2: Preparation of Non-Reactive Low Refractive Material 20.51 g of 2,2'-((oxybis(1,1,2,2-tetrafluoroethane-2,1-diyl))bis(oxy))bis(2,2-difluoroethan-1-ol was placed in a 1000 ml flask, dissolved in 500 g of tetrahydrofuran, and 4.40 g of sodium hydride (60% dispersion in mineral oil) was gently added several times while stirring at 0° C. After stirring at 0° C. for 20 minutes, 12.50 ml of 2-methoxy-ethoxymethyl chloride was slowly dropped. When all of the reactants were confirmed to be consumed by 1H NMR, the reaction solvent was completely removed under reduced pressure. The organic layer was collected by extracting three times with 300 g of dichloromethane, which was then filtered with magnesium sulfate, and all dichloromethane was removed under reduced pressure to obtain 29 g of a liquid product having a purity of 95% or more at a yield of 98%.

Examples and Comparative Examples: Preparation of Photopolymer Composition

As shown in Table 1 or Table 2 below, the (meth)acrylate-based polyol (co)polymer having a hydroxyl functional group in a branched chain of Preparation Example 1, the siloxane-based polymer containing a silane (Si—H) functional group, the non-reactive low-refractive material of Preparation Example 2, Safranin O (dye, manufactured by Sigma-Aldrich), silicone-based reactive additive (Tego Rad 2500) and methyl isobutyl ketone (MIBK) was mixed with light blocked, and stirred with a paste mixer for about 10 minutes. Karstedt's (Pt based) catalyst was added for matrix crosslinking, and liquid crosslinking was performed at room temperature for at least 30 minutes. After liquid crosslinking of the matrix, a photoreactive monomer (high refractive acrylate, refractive index 1.600, HR6022 [Miwon Specialty Chemical Co., Ltd.]) and a Borate V (Spectra Group) initiator were added to the coating solution, and further mixed for 5 minutes or more.

The coating solution was coated to a thickness of 10 to 15 μm on a TAC substrate having a thickness of 80 μm using a meyer bar, and dried at 60° C. within 10 minutes.

Experimental Examples: Holographic Recording (1) The photopolymer-coated surfaces prepared in each of Examples and Comparative Examples were laminated on a slide glass, and fixed so that a laser first passed through the glass surface at the time of recording.

(2) Measurement of diffraction efficiency ($\eta$)

A holographic recording was done via interference of two interference lights (reference light and object light), and a transmission-type recording was done so that the two beams were incident on the opposite side of the sample. The diffraction efficiencies change with the incident angle of the two beams, and become non-slanted when the incident angles of the two beams are the same. In the non-slanted recording, the diffraction grating is generated parallel to the film because the incident angles of the two beams are equal on the normal basis.

The recording (reference light=30° and object light=40°) was done in a transmission-type non-slanted manner using a laser with a wavelength of 532 nm, and the diffraction efficiency ($\eta$) was calculated according to the following Equation 1.

$$\eta = \frac{P_D}{P_D + P_T} \quad \text{[Equation 1]}$$

in Equation 1, $\eta$ is a diffraction efficiency, $P_D$ is an output amount (mW/cm$^2$) of the diffracted beam of a sample after recording, and $P_T$ is an output amount (mW/cm$^2$) of the transmitted beam of the recorded sample.

TABLE 1

Measurement results of Experimental Examples of the photopolymer compositions (unit: g) of Examples and the hologram recording medium prepared therefrom

| Category | | Example 1 | Example 2 | Example 3 | Example 4 |
|---|---|---|---|---|---|
| (meth)acrylate-based copolymer | Preparation Example 1 | 32.6 | 31.3 | 33.3 | 29.7 |
| Silane(SiH) group-containing siloxane-based polymer | Poly(methylhydro-siloxane), trimethylsilyl terminated (Sigma-Aldrich, Mn = 390) | 1.9 | | | |
| | Poly(dimethyl-siloxane-co-methyl-hydrosiloxane), trimethylsilyl terminated (Sigma-Aldrich, Mn = 950) | | 3.2 | | |
| | Poly(methylhydro-siloxane)(Sigma-Aldrich, Mn = 1700~3200) | | | 1.2 | |
| | Poly(dimethyl-siloxane), hydride terminated(Sigma-Aldrich, Mn = 580) | | | | 4.8 |
| Photoreactive monomer | HR6022 | 34.5 | 34.5 | 34.5 | 34.5 |
| Dye | safranin O | 0.2 | 0.2 | 0.2 | 0.2 |
| Borate salt | Borate V | 0.3 | 0.3 | 0.3 | 0.3 |
| Non-reactive low refractive material (P3) | Preparation Example 2 | 30 | 30 | 30 | 30 |
| Catalyst | Karstedt(Sigma-Aldrich) | 0.003 | 0.003 | 0.003 | 0.003 |
| Additive | Tego Rad 2500 | 0.3 | 0.3 | 0.3 | 0.3 |
| Solvent | MIBK | 234 | 234 | 234 | 234 |
| Coating thickness (unit: μm) | | 15 | 15 | 15 | 15 |
| Diffraction efficiency (%) | | 95 | 80 | 70 | 90 |

TABLE 2

Measurement results of Experimental Examples of the photopolymer compositions of Comparative Examples and the hologram recording medium prepared therefrom

| Category | | Comparative Example 1 | Comparative Example 2 | Comparative Example 3 |
|---|---|---|---|---|
| Polymer matrix | Polyvinyl acetate (Sigma-Aldrich/Mw = 50,000) | 27.6 | | |
| | Cellulose acetate Butyrate(Sigma-Aldrich/Mw = 70,000) | | 27.6 | |
| | Cellulose acetate propionate (Sigma-Aldrich/Mw = 75000) | | | 27.6 |
| Photoreactive monomer | HR6022 | 41.4 | 41.4 | 41.4 |
| Dye | safranin O | 0.2 | 0.2 | 0.2 |
| Borate salt | Borate V | 0.3 | 0.3 | 0.3 |
| Non-reactive low refractive material (P3) | Preparation Example 2 | 30 | 30 | 30 |
| Additive | Tego Rad 2500 | 0.5 | 0.5 | 0.5 |
| Solvent | MIBK | 200 | 200 | 200 |
| Coating thickness (unit: μm) | | 15 | 15 | 15 |
| Diffraction efficiency (%) | | 40 | 10 | 0 |

As seen from Table 1 and Table 2 above, the photopolymer composition to which the crosslinked matrix of the (meth)acrylate-based polyol (co)polymer having a hydroxyl functional group in a branched chain of Preparation Example 1 and a polymer containing a silane (S—H) group was applied showed a recording efficiency of 70% or more at a coating thickness of 15 μm.

On the contrary, the photopolymer compositions to which non-crosslinked commercial polymer products was applied as a matrix showed relatively low diffraction efficiency of 40% or less.

The invention claimed is:

1. A photopolymer composition for forming a hologram recording medium comprising:
    a polymer matrix or a precursor thereof formed by crosslinking a siloxane-based polymer containing at least one silane functional group (Si—H) and a (meth)acrylic polyol (co)polymer;
    a photoreactive monomer; and
    a photoinitiator.

2. The photopolymer composition according to claim 1, wherein the siloxane-based polymer containing at least one silane functional groups (Si—H) includes a repeating unit represented by Chemical Formula 1 or a repeating unit represented by Chemical Formula 2:

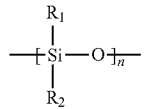

[Chemical Formula 1]

wherein in each of the repeating units of Chemical Formula 1, $R_1$ and $R_2$ are the same as or different from each other, and are hydrogen, halogen, or an alkyl group having 1 to 10 carbon atoms,
n is the number of repetitions of the repeating unit which is 1 to 10,000, and
in at least one of the repeating units, $R_1$ is an alkyl group having 1 to 10 carbon atoms and $R_2$ is hydrogen,

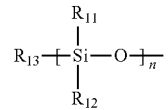

[Chemical Formula 2]

wherein in each of the repeating units of Chemical Formula 2, $R_{11}$ to $R_{13}$ are the same as or different from each other, and are hydrogen, halogen or an alkyl group having 1 to 10 carbon atoms, n is the number of repetitions of the repeating unit, which is 1 to 10,000, and in at least one of the repeating units, $R_{11}$ and $R_{13}$ are an alkyl group having 1 to 10 carbon atoms, $R_{12}$ is hydrogen, or $R_{11}$ and $R_{12}$ are an alkyl group having 1 to 10 carbon atoms, and $R_{13}$ is hydrogen.

3. The photopolymer composition according to claim 1, wherein the siloxane-based polymer containing at least one silane functional groups (Si—H) has number average molecular weight of 200 to 4,000.

4. The photopolymer composition according to claim 1, wherein the (meth)acrylic polyol (co)polymer has a structure in which two or more hydroxy groups are bonded to a main chain or side chain of an (meth)acrylate-based polymer, and wherein the (meth)acrylic polyol (co)polymer has a weight average molecular weight of 200,000 to 1,000,000.

5. The photopolymer composition according to claim 1, wherein the (meth)acrylic polyol (co)polymer has a hydroxy group equivalent of 500 g/equivalent to 2,500 g/equivalent.

6. The photopolymer composition according to claim 1, wherein the polymer matrix includes a hydrosilylation reactant between the siloxane-based polymer containing at least one silane functional group (Si—H) and the (meth)acrylic polyol (co)polymer.

7. The photopolymer composition according to claim 1, wherein the photoreactive monomer includes a polyfunctional (meth)acrylate monomer or a monofunctional (meth)acrylate monomer.

8. The photopolymer composition according to claim 1, wherein the photoreactive monomer has a refractive index of 1.5 or more.

9. The photopolymer composition according to claim 1, comprising 1% to 80 wt. % of the polymer matrix or the precursor thereof; 1% to 80 wt. % of the photoreactive monomer; and 0.1% to 20 wt. % of the photoinitiator.

10. The photopolymer composition according to claim 1, wherein the photopolymer composition further comprises a fluorine-based compound.

11. The photopolymer composition according to claim 10, wherein the fluorine-based compound comprises at least one functional group selected from the group consisting of an ether group, an ester group and an amide group, and at least two difluoromethylene groups.

12. The photopolymer composition according to claim 10, wherein the fluorine-based compound has a refractive index of less than 1.45.

13. The photopolymer composition according to claim 1, wherein the polymer matrix has a refractive index of 1.46 to 1.53.

14. A hologram recording medium comprising the photopolymer composition of claim 1.

15. An optical element comprising the hologram recording medium of claim 14.

16. A holographic recording method comprising selectively polymerizing photoreactive monomers contained in the photopolymer composition of claim 1 using a coherent light source.

* * * * *